United States Patent [19]

Ogura

[11] Patent Number: 4,899,106
[45] Date of Patent: Feb. 6, 1990

[54] PERSONALITY BOARD

[75] Inventor: Mitsuhiro Ogura, Kunitachi, Japan

[73] Assignee: Hewlett Packard Company, Palo Alto, Calif.

[21] Appl. No.: 225,492

[22] Filed: Jul. 28, 1988

[30] Foreign Application Priority Data

Aug. 18, 1987 [JP] Japan .................. 62-125439[U]

[51] Int. Cl.⁴ ................ G01R 31/02; G01R 1/06
[52] U.S. Cl. ..................... 324/158 F; 324/158 P
[58] Field of Search ............ 324/158 F, 158 P, 72, 324/5, 73 PC

[56] References Cited

U.S. PATENT DOCUMENTS 4,574,235 3/1986 Kelly et al. .............. 324/158 F

Primary Examiner—Ernest F. Karlsen
Attorney, Agent, or Firm—Woodcock Washburn Kurtz Mackiewicz & Norris

[57] ABSTRACT

A semiconductor wafer tester personality board having groups of contact pads on an upper subboard providing contact points for a test head input/output spring pins and a lower, underlying subboard is provided. Each pad group includes a force pad, a sense pad and a guard pad and is partially enclosed by a guard pattern of an electrically conductive material which is electrically connected to the guard pad. The pad groups are further separated by slits formed in the upper subboard separating adjacent groups. Within the groups, the force pad is electrically separated from the sense pad allowing separate lead wires to the semiconductor wafer under test.

5 Claims, 3 Drawing Sheets

FIG.1(a')

PERSONALITY BOARD

TECHNICAL FIELD

The present invention relates generally to a personality board to be used in a semiconductor wafer tester and more specifically to an intermediate personality board connecting signal inputs and outputs between a probing device having probe needles and a test head.

BACKGROUND ART

It is well-known in the prior art to measure the characteristics of a semiconductor wafer utilizing a wafer tester assembly as shown in Fig. Reference numeral 101 designates generally a tester body, or a test head, which comprises an internal switching matrix and spring pins 102 which act as testing terminals. Reference numeral 106 designates a probe board comprising a printed circuit wherein the traces on the surface form a signal pattern which is connected to a semiconductor wafer to be tested with test probes or needles 107. Reference numeral 103 designates a personality board which couples test head 101 to the probe board 106 and provides a degree of freedom to the connections between the spring pins 102 and the probe board 106 and prevents damage to the probe board 106 resulting from the direct application of the pressures of the spring pins 102 to the probe board 106. The personality board 103 comprises a printed circuit board having a signal pattern formed or printed on its surface which is connected with the probe board 106 via flexible lead wires 105. The personality board 103 is mounted on a prober by an insert ring 104. Reference numeral 108 designates a semiconductor wafer to be tested. Typically, the geometric shape of the personality board 103 and the probe board 106 is that of an annular disc.

The personality board of the prior art is constructed such that the printed circuit signal patterns are merely enclosed thereon with traces or plated areas of an electrically conducting material known as guard patterns so as to insulate the adjoining signal patterns from each other. The prior art construction fails to ensure complete insulation between the signal patterns thus making it difficult to measure small electric currents, several picoamperes, for example. Solutions to this problem include the development of a personality board having enhanced insulation between the signal patterns effected by separating the signal patterns by slits and enclosing the signal patterns with the guard patterns. This construction is disclosed in Japanese Utility Model Application No. 57-86493.

In the personality board having the latter construction, the leakage current between the signal patterns can be reduced to a remarkably low level thereby allowing the measurement of a very small amount of current. Since, however, the four-wired measuring force lines (for current applications) and sense lines (for voltage detections) are coupled to each other on the personality board, the personality board and the semiconductor wafer must be connected through one wire for each signal. Nor can the four-wired connection be extended to the vicinity of the semiconductor wafer under test DUT. As a result, this prior art personality board is influenced by the impedance of the connecting wires when a high current is applied, such that measurements having acceptable small errors cannot be accomplished.

An objective of the present invention is to provide a personality board which enhances the insulation between signal patterns thereby allowing the measurement of very small amounts of current.

A second objective of the present invention is to provide force lines and sense lines in a separated state to a probe board to effect a four-wired connection in the vicinity of a semiconductor wafer under test so that a measurement with acceptable small errors can be accomplished even when large currents are applied.

DISCLOSURE OF THE INVENTION

According to one embodiment of the present device, the force lines and the sense lines are electrically separated on the personality board. This construction enables the accomplishment of a four-wired connection (Kelvin connection) in the vicinity of the semiconductor wafer under test in a measurement path extending from the test head through the personality board to the semiconductor wafer so that the measurement can be performed with small errors even when a large current is applied.

BRIEF DESCRIPTION OF THE DRAWINGS

FIG. 2b is a bottom view in perspective of the upper subboard shown in FIG. 2a;

FIG. 2c is a top view in perspective of a lower subboard of the personality board;

FIG. 3b is a bottom plan view of the personality board shown in FIG. 3a;

FIG. 4a is a top plan view of an alternate embodiment of portions of the personality board of the present invention; and FIG. 4b is a bottom plan view of the personality board shown in FIG. 4a.

BEST MODE FOR CARRYING OUT THE INVENTION

Figure 2A:
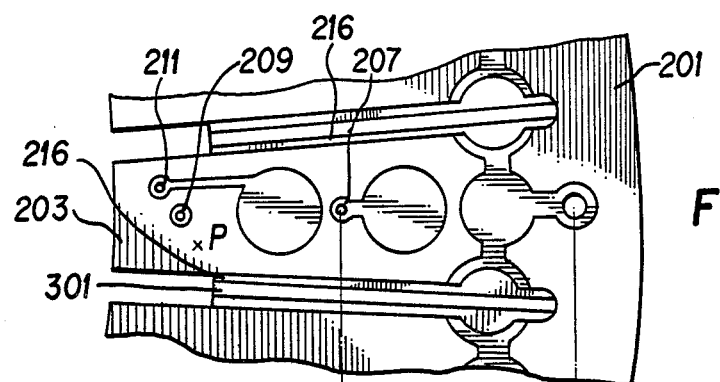
FIG. 2a is a top view in perspective of an upper subboard of the personality board.
Figure 2B:
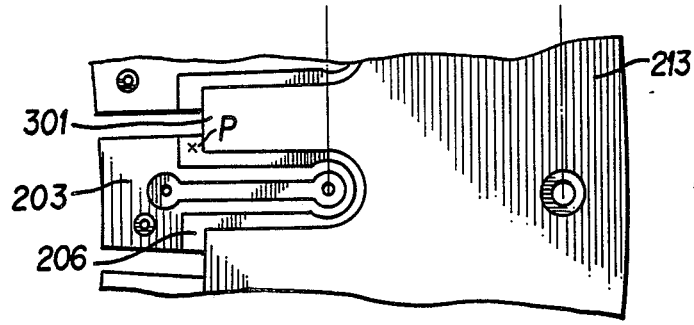
Figure 3A:
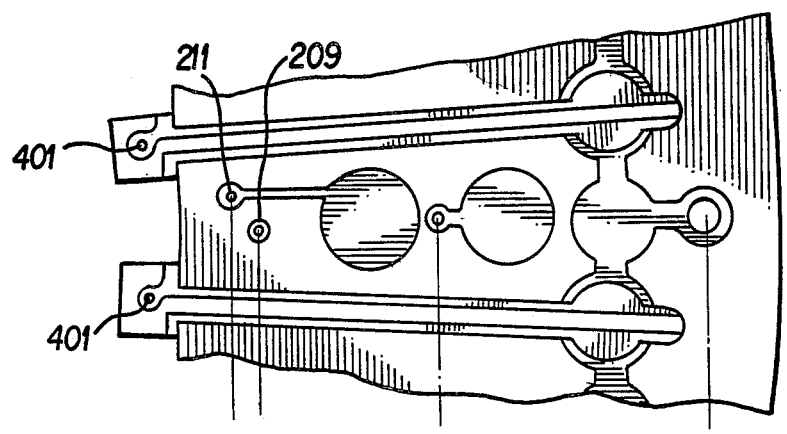
FIG. 3a is a top plan view of portions of the personality board shown in FIGS. 2a-2c.
Figure 3B:
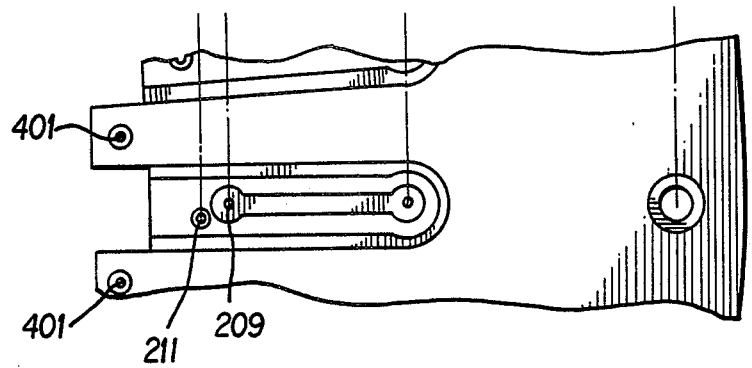

Referring now also to FIGS. 2a-2c and 3a-3b, an exploded view of portions of a first preferred embodiment of a personality board according to the principles of the present invention is shown. The personality board is comprised of two subboards, an upper subboard 201 and a lower subboard 213. FIG. 2a is a top view in perspective showing the upper subboard 201 and FIG. 2b is a bottom plan view in perspective of the upper subboard 201. FIG. 2c is a top plan view in perspective of the lower subboard 213. FIG. 3a is a top plan view of the upper subboard 201 and FIG. 3b is a top plan view of the lower subboard 213. In the various figures, like or same components are designated with like reference numerals.

Figures 1, 1A:
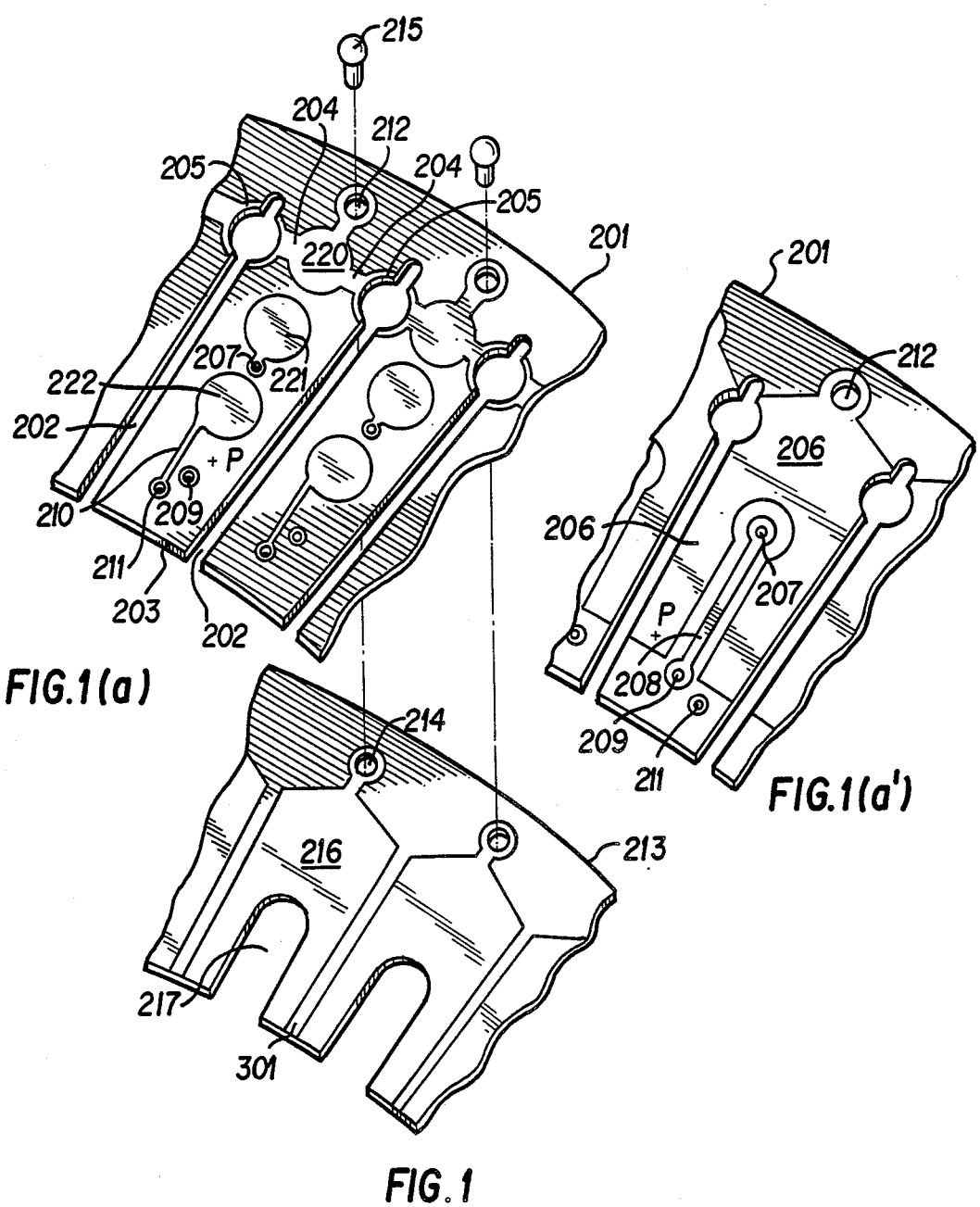
FIG. 1 is a cross-sectional view illustrating a prior art tester for measuring the characteristics of a semiconductor wafer.

In FIGS. 2a-2c and 3a-3b, an upper subboard 201 and a lower subboard 213 are made of an insulating material such as glass - epoxy resin. The upper subboard 201 comprises sections or protrusions 203 formed by slits 202 in the insulating material. The lower subboard 213 is formed with guard patterns 216 on its surface. The upper subboard 201 has pads 220, 221 and 222 contacted by the spring pins 102 for exchanging guard, force and sense signals, respectively, in the recited order, with the tester body 101 (as shown in FIG. 1). The pads 220 are connected through guard patterns 204 and 205 with guard patterns 206 formed on the back of the upper subboard 201. The guard patterns 205 are formed by dividing the through-holes with the slits 202. The pads 221 are connected through through-holes 207 and conductor patterns 208 with (force) signal lead-out through-holes 209. The pads 222 are connected through conductor patterns 210 with (sense) signal lead-out through-holes 211. The through-holes 209 and 211 are usually connected with lead wires 105 for generally coupling the input and output signals between the probing device and the personality board. The upper subboard 201 and the lower subboard 213 are mounted by means of rivets 215, which are fitted in through-holes 212 and 214, and have their guard patterns 206 and 216 coupled electrically to each other. Notches 217 are formed to prevent the force conductor patterns 208 and the guard patterns 216 from contacting with each other. As seen in FIG. 3, moreover, the guard patterns are so formed as can be observed with some width even from both the two sides of the personality board.

In the personality board thus constructed, the adjacent signal patterns are separated by short distances and the slits 202; the signal patterns and the insert ring 104 (for mounting the personality board) are separated by the notches 217. Moreover, the signal patterns are enclosed by the guard patterns 204, 205, 206 and 216. As a result, any leakage current between the adjacent signal patterns which flows in the interior of the board is bypassed by the slits 202; any leakage current flowing on the board surface or between the signal patterns and the insert ring is sunk or absorbed by the guard patterns. Any dust which accumulates between the upper and the lower subboards, may establish another leakage current path. In the personality board of the present invention, however, the guard patterns 216 and 206 on the top surface of the lower subboard 213 and on the bottom surface of the upper subboard 201, respectively, are made wider than the protrusions 301 as seen from FIG. 3a–3b, so the dust of ordinary size is caught between the guard patterns 206 and 216 preventing any leakage current.

As has been described hereinbefore, in the personality board of the present invention, the individual signal patterns 208, 210 are highly insulated to reduce the leakage current to a remarkably minute level, and, at the same time, the signals can be outputted from the personality board while maintaining the force lines and the sense lines separate. Maintaining the force lines and the sense lines separate allows a four-wire connection (Kelvin connection) to be made physically closer to the semiconductor wafer under test resulting in less measurement error when large currents are applied. Since the personality board is constructed by overlapping the upper subboard 201 and the lower subboard 213, it has sufficient strength to prevent damage which may be caused by the pressure of the spring pins 102.

Figure 4:
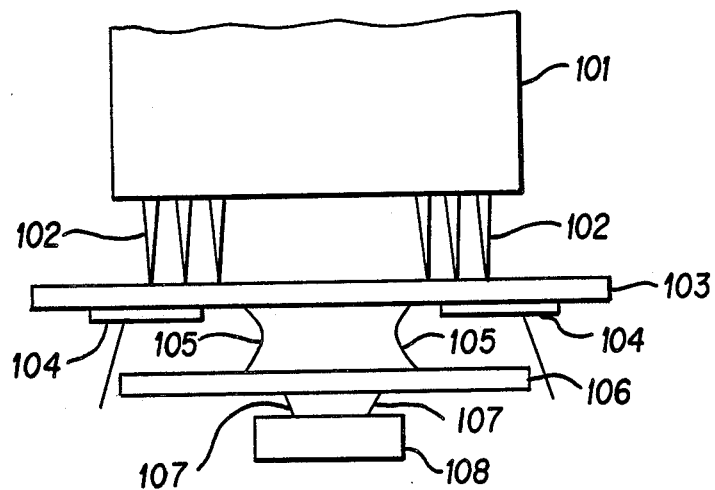

If the guard patterns are to be connected to the probe board 106, guard signal lead-out through-holes (not shown) may be formed in the upper subboard 201 at points P as shown in FIGS. 2a–2c and 3a–3b; i.e., at the leading ends of the guard patterns 206 on the back or bottom surface of the upper subboard 201. As seen from FIG. 4a–4b, alternatively the protrusions 301 of the lower subboard 213 may be extended radially towards the center of the annular disc to lead the guard patterns 216 to the leading end portions thereof (it is accordingly necessary to extend the guard patterns 206 of the upper subboard 201 to the leading end) thereby to form guard signal lead-out through-holes 401.

In a second preferred embodiment, force line signals may be connected to the lead-out through-holes 209 by forming a conductor pattern from the pads 221 to the through-holes 209 on the top surface of the upper subboard 201. The guard patterns 206 on the bottom surface of the protrusions 203 of the upper subboard are filled in over the entire surface and thus eliminate the requirement for notches 217 of the lower subboard 213. However, since the pads 221, 222 of the personality board are required to have a minimum size and the maximum size of the personality board itself is limited, the second preferred embodiment is limited to applications in which only small numbers of signals are to be measured.

I claim:

1. A personality board for use with a semiconductor wafer test set interposed between a test set test head and a probe card, said personality board comprising:
a plurality of electrically conductive pad groups disposed on a circuit board of insulating material, each of said pad groups corresponding to a terminal group of said test head, said terminal group including at least a first terminal, a second terminal and a third terminal;
each pad group disposed on said circuit board in spaced-apart relationship with each of the other pad groups, each pad group separated from adjacent pad groups by a slit in said insulating material;
an electrically conductive material disposed on said circuit board in a predetermined pattern forming a first guard pattern surrounding and enclosing said plurality of pad groups, said first guard pattern electrically connected to the pad in each of said plurality of pad groups corresponding to said third terminal; and
each of the pads in each group corresponding to said first terminal and said second terminal, respectively, being electrically separated from each other on said circuit board.

2. A personality board as in claim 1 wherein said circuit board has a generally annular shape, said slits extending radially outward from the central area of said annular shaped circuit board forming a plurality of circuit board sections, each pad group disposed on a different circuit board section.

3. A personality board as in claim 2 wherein said circuit board comprises an upper and a lower subboard, each having a top and bottom surface, said upper subboard overlapping and fixedly attached to said lower subboard.

4. A personality board as in claim 3 wherein said upper subboard is comprised of said sections separated by said slits, said plurality of pad groups disposed on said top surface of said upper subboard, at least one pad of each group, said one pad not electrically connected to said first guard pattern, extending through a through-hole in said upper subboard to form an associated electrically conductive trace pattern on said bottom surface of said upper subboard, said first guard pattern extending through a plurality of through-holes in said upper subboard and covering portions of each upper subboard section on said bottom surface to partially enclose said associated trace patterns.

5. A personality board as in claim 4 wherein said lower subboard top surface is divided into a plurality of radial sections corresponding to said upper subboard sections, each of said radial sections partially covered by an electrically conductive material forming a plurality of second guard patterns, each of said second guard patterns separated from adjacent second guard patterns by a radially outwardly extending line of uncovered insulating material, each of said second guard patterns having a notch formed therein, said notch extending through said lower subboard, said notch located so as to partially enclose said associated trace pattern when said upper subboard is mounted on said lower subboard in overlapping relationship, said first guard pattern electrically coupled to said second guard pattern.

* * * * *

UNITED STATES PATENT AND TRADEMARK OFFICE
CERTIFICATE OF CORRECTION

PATENT NO. : 4,899,106
DATED : February 6, 1990
INVENTOR(S) : Mitsuhiro Ogura

It is certified that error appears in the above-identified patent and that said Letters Patent is hereby corrected as shown below:

```
Col. 1, line 14, after "Fig." insert --1--.

Col. 2, line 26, Fig. 2 was omitted, insert --Fig. 2 is an exploded view in perspective illustrating the various portions of a personality board according to the principles of the present invention.--
```

Signed and Sealed this

Sixteenth Day of April, 1991

Attest:

HARRY F. MANBECK, JR.

*Attesting Officer*  *Commissioner of Patents and Trademarks*